United States Patent
Chi

(10) Patent No.: US 10,384,901 B2
(45) Date of Patent: Aug. 20, 2019

(54) SPLICING DEVICE AND TAPE DETECTING METHOD USING THE SAME

(71) Applicant: FUJI CORPORATION, Chiryu-shi (JP)

(72) Inventor: Xiao Dong Chi, Nagoya (JP)

(73) Assignee: FUJI CORPORATION, Chiryu-shi (JP)

(*) Notice: Subject to any disclaimer, the term of this patent is extended or adjusted under 35 U.S.C. 154(b) by 0 days.

(21) Appl. No.: 15/570,031

(22) PCT Filed: Apr. 28, 2015

(86) PCT No.: PCT/JP2015/062812
§ 371 (c)(1),
(2) Date: Oct. 27, 2017

(87) PCT Pub. No.: WO2016/174737
PCT Pub. Date: Nov. 3, 2016

(65) Prior Publication Data
US 2018/0111775 A1    Apr. 26, 2018

(51) Int. Cl.
*B65H 19/18* (2006.01)
*B65H 20/20* (2006.01)
(Continued)

(52) U.S. Cl.
CPC ......... *B65H 19/18* (2013.01); *B65H 19/1852* (2013.01); *B65H 20/20* (2013.01);
(Continued)

(58) Field of Classification Search
CPC .... B65H 19/18; B65H 19/1852; B65H 20/20; B65H 2701/11332; B65H 2701/1942;
(Continued)

(56) References Cited

U.S. PATENT DOCUMENTS

2003/0219330 A1* 11/2003 Lyndaker ........... H05K 13/0419
  414/411
2007/0041729 A1*  2/2007 Heinz ................. G01B 11/303
  398/25

FOREIGN PATENT DOCUMENTS

JP    2002-176290 A    6/2002
JP    2010-10238 A     1/2010
(Continued)

OTHER PUBLICATIONS

Machine Translation of IDS document WO 2013/157107 A1, WIPO, Oct. 24, 2013 (Year: 2013).*

(Continued)

*Primary Examiner* — George R Koch
(74) *Attorney, Agent, or Firm* — Oblon, McClelland, Maier & Neustadt, L.L.P.

(57) ABSTRACT

A splicing device includes a first detection section which detects whether or not the component storage section protrudes downward from the conveyance reference surface; a second detection section which detects the component storage section of the paper tape; a discrimination section which determines whether a tape inserted into the splicing device is the embossed tape or the paper tape based on a detection signal of the first detection section; a first calculating section which calculates a pitch of the component storage section of the embossed tape by using the first detection section in a case where the embossed tape is determined; and a second calculating section which calculates a pitch of the component storage section of the paper tape by using the second detection section in a case where the paper tape is determined.

4 Claims, 14 Drawing Sheets

(51) Int. Cl.
*H05K 13/08* (2006.01)
*H05K 13/02* (2006.01)
*H05K 13/04* (2006.01)

(52) U.S. Cl.
CPC ......... *H05K 13/02* (2013.01); *H05K 13/0215* (2018.08); *H05K 13/0417* (2013.01); *H05K 13/08* (2013.01); *H05K 13/081* (2018.08); *B65H 2301/4631* (2013.01); *B65H 2401/15* (2013.01); *B65H 2511/214* (2013.01); *B65H 2553/41* (2013.01); *B65H 2553/412* (2013.01); *B65H 2553/414* (2013.01); *B65H 2557/51* (2013.01); *B65H 2701/11332* (2013.01); *B65H 2701/1942* (2013.01)

(58) Field of Classification Search
CPC .......... B65H 2553/41; B65H 2553/412; B65H 2553/414; H05K 13/0215; H05K 13/021
See application file for complete search history.

(56) References Cited

FOREIGN PATENT DOCUMENTS

| JP | 2010-186811 A | 8/2010 |
|---|---|---|
| WO | WO 2013/157106 A1 | 10/2013 |
| WO | WO 2013/157107 A1 | 10/2013 |
| WO | WO 2014/103395 A1 | 7/2014 |

OTHER PUBLICATIONS

International Search Report dated Jul. 28, 2015 in PCT/JP2015/062812 filed Apr. 28, 2015.

* cited by examiner

(12) United States Patent

SPLICING DEVICE AND TAPE DETECTING METHOD USING THE SAME

This application is a 371 of PCT/JP2015/062812, filing date Apr. 28, 2015.

TECHNICAL FIELD

The present application relates to a splicing device which automatically connects a tail end section and a starting end section of two carrier tapes to each other, and a tape detecting method using the same.

BACKGROUND ART

In a general component mounting machine, a carrier tape in which multiple electronic components are stored at a constant interval is wound around a reel, a sprocket engaged with a feeding hole (sprocket hole) of the carrier tape is driven, and accordingly, the carrier tape is fed by a determined amount, and electronic components are supplied to a suction position at which the electronic components are sucked by a suction nozzle.

In this type of component mounting machine, when a residual amount of the electronic components stored in one reel is reduced, so-called splicing, that is, connecting the starting end section of the carrier tape wound around another reel in which the same type of electronic components are stored to the tail end section of the carrier tape of which the residual amount is reduced by the splicing tape, is performed. A technology in which the splicing is automatically performed in this manner is described, for example, in PTL 1.

However, in the related art, not the splicing device, but a technology for determining whether a carrier tape mounted on a tape feeder is an embossed tape or a paper tape (punched tape) is described in PTL 2. The technology described in PTL 2 determines whether the carrier tape mounted on the tape feeder is the embossed tape or the paper tape by providing a light sensor that can detect an embossed section (component storage section) which protrudes downward from a conveyance reference surface, by monitoring an output signal of the light sensor, and by detecting the presence or absence of the embossed section. In addition, in accordance with the discrimination result, a height position of the component to be sucked by the suction nozzle is controlled.

CITATION LIST

Patent Literature

PTL 1: International Publication No. 2013/157107
PTL 2: JP-A-2010-10238

SUMMARY

Technical Problem

In the splicing device described in PTL 1, by employing the technology described in PTL 2, it is possible to determine whether a carrier tape inserted into the splicing device is the embossed tape or the paper tape.

However, in the splicing device, multiple types of pitches of the component storage section of the two carrier tapes inserted from both sides of the splicing device exist, and it is necessary not only to change each of cutting parts (splicing parts) of the carrier tape in accordance with the pitches of the component storage section, and but also to change a detecting method of the pitch of the component storage section in accordance with whether the tape is the embossed tape or the paper tape.

In particular, since the embossed tape is manufactured by a chemical product, such as a polystyrene resin, there is a case where a material or transparency of the resin respectively varies, and in a simple light sensor, there is a case where it is not possible to accurately detect the component storage section (embossed section).

In order to solve the above-described problems, an object of the present disclosure is to provide a splicing device which calculates pitches of each component storage sections of the embossed tape and the paper tape by using different detection sections in accordance with a discrimination result whether a carrier tape is an embossed tape or a paper tape, and a tape detecting method using the same.

Solution to Problem

In order to solve the above-described problem, there is provided a splicing device which can splice an embossed tape in which component storage sections are formed at a constant interval at a lower position than a conveyance reference surface, and a paper tape in which the component storage sections are formed at a constant interval at an upper position than the conveyance reference surface, including: a first detection section which detects whether or not the component storage section protrudes downward from the conveyance reference surface; a second detection section which detects the component storage section of the paper tape; a discrimination section which determines whether a tape inserted into the splicing device is the embossed tape or the paper tape based on a detection signal of the first detection section; a first calculating section which calculates a pitch of the component storage section of the embossed tape by using the first detection section in a case where the discrimination section determines that the embossed tape is inserted; and a second calculating section which calculates a pitch of the component storage section of the paper tape by using the second detection section in a case where the discrimination section determines that the paper tape is inserted.

Advantageous Effects

According to the present disclosure, in accordance with the discrimination result whether the tape inserted into the splicing device is the embossed tape or the paper tape, by using each of the detection sections that corresponds to the characteristics of the embossed tape or the paper tape, it is possible to accurately calculate the pitch of the component storage sections of both of the tapes. As a result, in accordance with the pitch of the component storage section, it is possible to respectively cut the embossed tape and the paper tape at an accurate cutting part.

DESCRIPTION OF EMBODIMENTS

Figure 1:
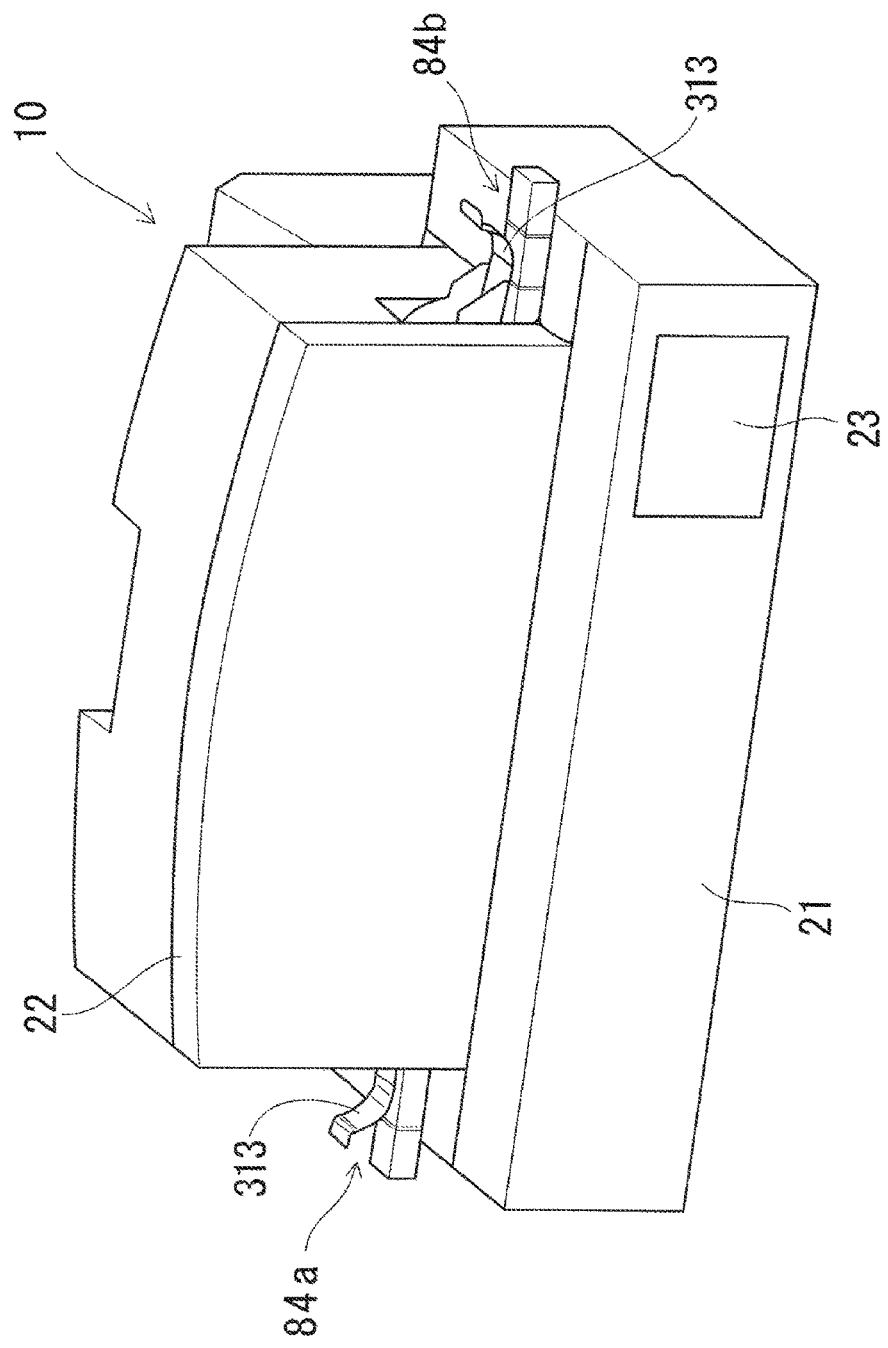
FIG. 1 is an external view of a splicing device illustrating an embodiment of the present disclosure.

Hereinafter, embodiments of the present disclosure will be described based on the drawings. FIG. 1 illustrates a splicing device 10, and the splicing device 10 is a device which automatically splices (connects) a tail end section of a carrier tape 100 (refer to FIGS. 2 and 4) mounted on a tape feeder which is not illustrated to a starting end section of a new carrier tape 100 by using a splicing tape.

The splicing device 10 includes a device main body 21, a cover 22 which vertically moves (is open and closed) with respect to the device main body 21, and a control section 23 which controls the splicing device 10, and is configured to be movable between the tape feeders which are mounted on a component supply device of a component mounting machine loaded on a wheeled table or the like which is not illustrated.

The cover 22 of the splicing device 10 is held in a closed (lowered) state during the splicing, but the cover 22 is open (raised) by a splicing completion signal, and the spliced carrier tape 100 is taken out from the splicing device 10.

As illustrated in FIGS. 2 to 5, the carrier tape 100 spliced by the splicing device 10 forms a component storage section 100a which stores multiple components Pa, such as electronic components, therein, at a predetermined interval in a longitudinal direction of a tape. A cover tape 100b which closes the component storage section 100a is attached to an upper face of the carrier tape 100. In one side portion of the carrier tape 100, feeding holes (sprocket hole) 100c penetrate at a constant interval in the longitudinal direction of the tape, sprockets 61a are engaged with the sprocket holes 100c, and the carrier tape 100 is conveyed.

Figure 2:
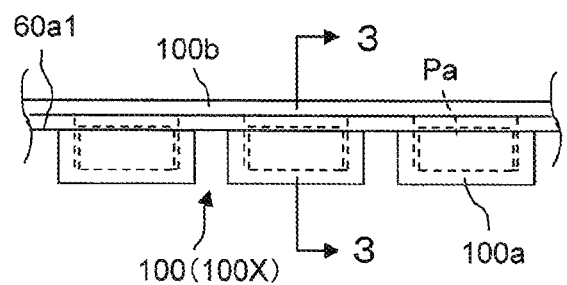
FIG. 2 is a side view illustrating a carrier tape configured of an embossed tape spliced by the splicing device.
Figure 3:
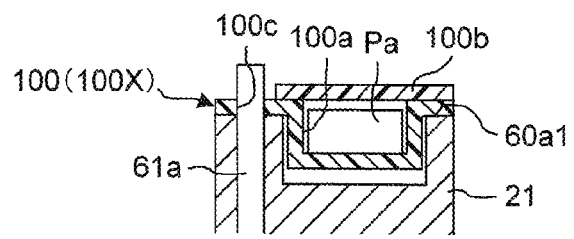
FIG. 3 is a sectional view cut along line 3-3 of FIG. 2.
Figure 4:
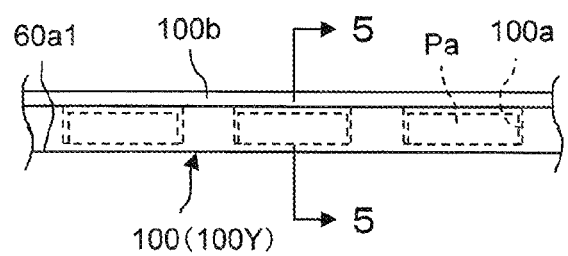
FIG. 4 is a side view illustrating the carrier tape configured of a paper tape.
Figure 5:
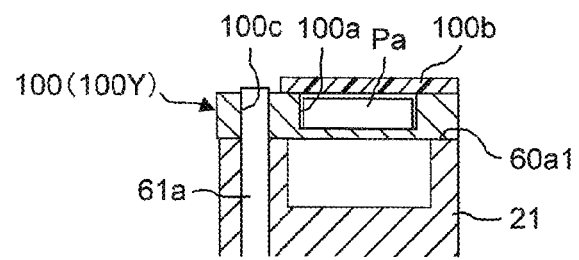
FIG. 5 is a sectional view cut along line 5-5 of FIG. 4.

As the carrier tape 100, as illustrated in FIGS. 2 and 3, there are an embossed type carrier tape 100 in which the component accommodation section 100a protrudes to a lower position from a conveyance reference surface 60a1 of conveyance paths 60a and 60b which will be described later (hereinafter, this is referred to as an embossed tape 100X), and as illustrated in FIGS. 4 and 5, a non-embossed type carrier tape 100 in which the component accommodation section 100a is disposed at an upper position than the conveyance reference surface 60a1, that is, component accommodation section 100a does not protrude to the lower position from the conveyance reference surface 60a1 (hereinafter, this is referred to as a paper tape 100Y).

As illustrated in FIGS. 2 and 3, the embossed tape 100X stores the components (electronic components) Pa one by one in each of the embossed sections (component accommodation sections) 100a formed in a row at a constant pitch in a resin tape, and has the cover tape 100b on an upper face of the resin tape attached to be peelable.

Meanwhile, as illustrated in FIGS. 4 and 5, the paper tape 100Y stores the components (electronic components) Pa one by one in the component storage sections 100a recessed at a constant pitch in a paper tape, and has the cover tape 100b on the upper face of the paper tape to be peelable.

In FIGS. 6A to 6D, the multiple types (four types in the embodiment) of carrier tapes 100 (100A to 100D) which can be connected to each other by the splicing device 10 is illustrated as an example. All of the four types of carrier tapes 100A to 100D have the same pitch Ph of the sprocket hole 100c, but the pitches of the component storage sections 100a are different from each other, and a tape width also varies in accordance with the size of the component storage section 100a.

Figure 6A:
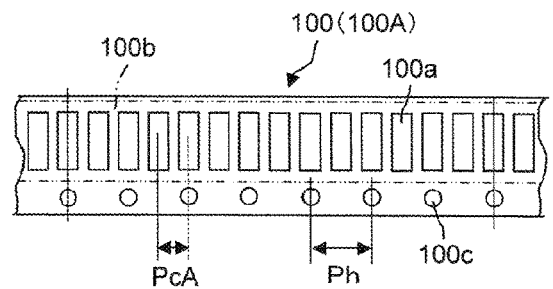
FIG. 6A is a view illustrating the carrier tape of which the pitch of the component storage section is ½ of the pitch of the feeding hole.

In other words, one type of the carrier tapes 100A is a carrier tape in which the component storage sections 100a are installed at a pitch interval PcA that is ½ of the pitch Ph of the sprocket hole 100c, and the center of the sprocket hole 100c is identical to a center position of the component storage section 100a (refer to FIG. 6A).

Figure 6B:
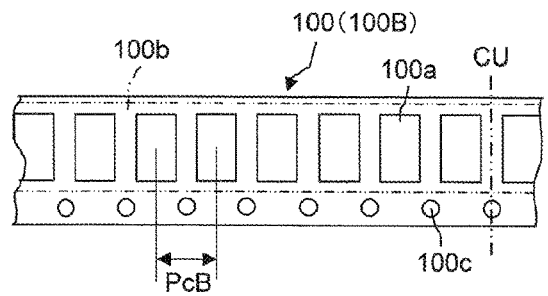
FIG. 6B is a view illustrating the carrier tape of which the pitch of the component storage section is the same as the pitch of the feeding hole.

Two types of carrier tapes 100B are carrier tapes in which the component storage sections 100a are installed at a pitch interval PcB that is the same as the pitch Ph of the sprocket hole 100c, and the center of the sprocket hole 100c is identical to an intermediate position of the component storage sections 100a adjacent to each other (refer to FIG. 6B).

Figure 6C:
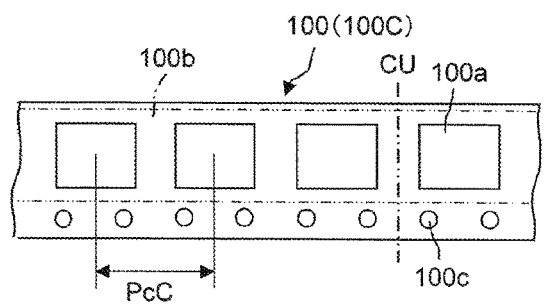
FIG. 6C is a view illustrating the carrier tape of which the pitch of the component storage section is two times the pitch of the feeding hole.

Three types of carrier tapes 100C are carrier tapes in which the component storage sections 100a are installed at a pitch interval PcC that is two times the pitch Ph of the sprocket hole 100c, and the center of the component storage section 100a is identical to the intermediate position of the sprocket holes 100c adjacent to each other (refer to FIG. 6C).

Figure 6D:
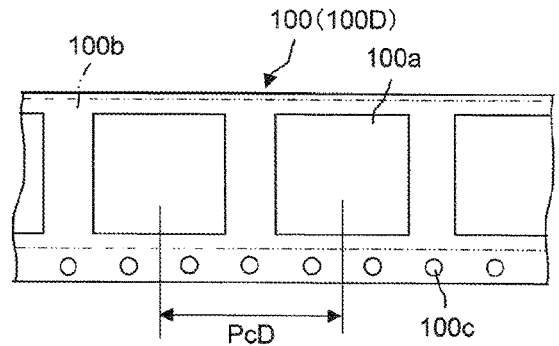
FIG. 6D is a view illustrating the carrier tape of which the pitch of the component storage section is three times the pitch of the feeding hole.

Four types of carrier tapes 100D are carrier tapes in which the component storage sections 100a are installed at a pitch interval PcD that is three times the pitch Ph of the sprocket hole 100c, and the center of the component storage section 100a is identical to the intermediate position of the sprocket holes 100c adjacent to each other (refer to FIG. 6D).

Among these four types of carrier tapes 100A to 100D, as the paper tape 100Y, tapes of which the pitch of the component storage section 100a is ½ of and equal to the pitch Ph of the sprocket hole 100c (100A and 100B) are used, and as the embossed tape 100X, tapes of which the pitch of the component storage section 100a is equal to or greater than the pitch Ph of the sprocket hole 100c (100B to 100D) are used.

However, in a case of splicing the multiple types of carrier tapes 100 having different pitches of the component storage section 100a, in general, a cutting part (splicing part) CU of the carrier tape 100 is set at a position (a position which does not go across the component storage section 100a) that avoids the component storage section 100a. Therefore, for example, in a case of the carrier tape 100B of which the pitches of the component storage section 100a and the sprocket hole 100c which are illustrated in FIG. 6B are equivalent to each other, the center of the sprocket hole 100c is regarded as the cutting part CU. In addition, in a case of the carrier tape 100C illustrated in FIG. 6C, each of the intermediate positions of the component storage section 100a and the sprocket hole 100c is regarded as the cutting part CU.

In addition, in both end sections of each of the carrier tapes 100, in general, parts including the empty component storage section 100a in which the components are not stored are provided by approximately several tens of mm. Therefore, before inserting two carrier tapes 100 into the splicing device 10, by allowing the empty component storage section 100a to remain, for example, two by two, the end section of the carrier tape 100 is cut by an operator. In this case, since the section is not a surface on which the two carrier tapes 100 abut against each other, particular accuracy is not required.

Figure 7:
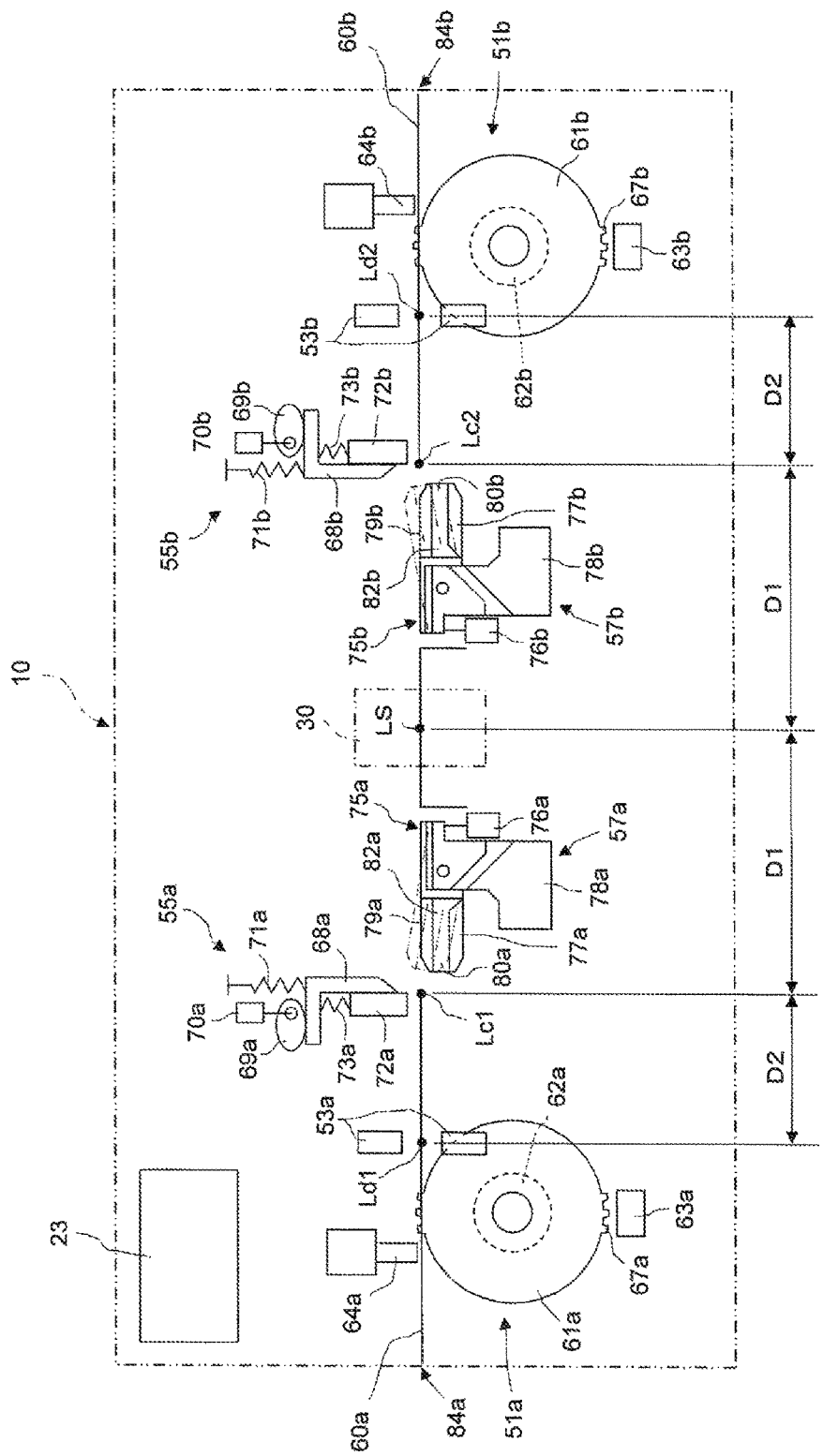
FIG. 7 is a schematic view illustrating an outline of a configuration of the splicing device.

FIG. 7 schematically illustrates a configuration of the splicing device 10. On both of the left and right sides of the device main body 21 and the cover 22 (refer to FIG. 1) of the splicing device 10, tape insertion ports 84a and 84b through which the two carrier tapes 100 are inserted into the device main body 21 are respectively provided between the device main body 21 and the cover 22. In addition, in a center section of the device main body 21 and the cover 22, a splicing position Ls in which a tape splicing section 30 which connects end sections of the two carrier tapes 100 to each other by using a splicing tape that is not illustrated is installed, is provided.

Between the splicing position Ls and each of the tape insertion ports 84a and 84b, tape conveyance sections 51a and 51b which convey each of the carrier tapes 100 inserted into the tape insertion ports 84a and 84b toward the splicing position Ls, are respectively provided. The tape conveyance sections 51a and 51b include conveyance paths 60a and 60b which form the conveyance reference surface 60a1 (refer to FIGS. 2 to 5), and on each of the conveyance paths 60a and 60b, tape cutting positions Lc1 and Lc2 are respectively disposed at positions separated from the splicing position Ls by a predetermined amount D1. At the tape cutting positions Lc1 and Lc2, tape cutting sections 55a and 55b which cut a tip portion of the carrier tape 100 at a predetermined cutting part, and take-in sections 57a and 57b which take in an unnecessary part of the distal end, are installed.

In addition, on each of the conveyance paths 60a and 60b of the tape conveyance sections 51a and 51b, between each of the tape cutting positions Lc1 and Lc2 and each of the tape insertion ports 84a and 84b, tape detection positions Ld1 and Ld2 are respectively disposed at positions separated from the tape cutting positions Lc1 and Lc2 by a predetermined amount D2. At the tape detection positions Ld1 and Ld2, first detection sections 53a and 53b (refer to FIG. 8) which detect the embossed section (component storage section) 100a of the embossed tape 100X, and second detection sections 54a and 54b which detect the component storage section 100a of the paper tape 100Y, are respectively installed.

In addition, the tape insertion port 84a installed on the left side of the drawing, the tape conveyance section 51a, the first and second detection sections 53a and 54a, the tape cutting sections 55a and the take-in section 57a, the tape insertion port 84b installed on the right side of the drawing, the tape conveyance section 51a, the first and second detection sections 53b and 54b, and the tape cutting sections 55b and the take-in section 57b in the splicing device 10, have the same configuration to be left-right symmetric to each other regarding the splicing position Ls as the center. Therefore, hereinafter, a configuration with a of a left half of FIG. 7 will be described, and description of a configuration with b of a right half will be omitted.

Figure 8:
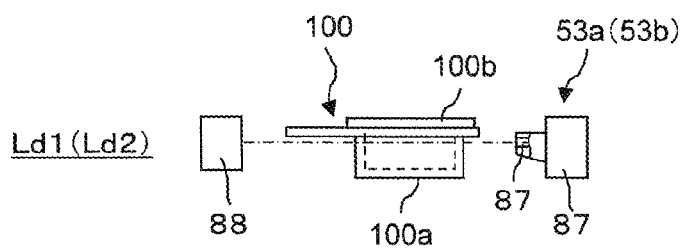
FIG. 8 is a view illustrating a configuration of a first detection section.

As illustrated in FIG. 8, the first detection section 53a is configured of a laser sensor 87, and the laser sensor 87 is a regressive reflection type laser sensor including a sensor main body 87a which projects laser beam light and receives the reflected light, and a reflection plate 87b which nips the carrier tape 100 and opposes the carrier tape 100 in a horizontal direction, and reflects the laser beam light from the sensor main body 87a. A detection signal (sensor output) of the laser sensor 87 is transmitted to the control section 23 embedded in the device main body 21. The laser sensor 87 detects the embossed section 100a by shielding the laser beam light from the sensor main body 87a by using the embossed section (component storage section) 100a of the embossed tape 100X while the carrier tape 100 is conveyed by a predetermined amount or more.

At this time, by using the regressive reflection type laser sensor 87, the laser beam light protected by the sensor main body 87a becomes a longitudinal wave, a phase of the laser beam light reflected by the reflection plate 87b is converted and the laser beam light becomes a lateral wave, and thus, regardless of the material or transparency of the resin of the embossed tape 100X, it is possible to accurately detect the presence or absence of the embossed section 100a.

In addition, as the embossed tape 100X, since there is also a tape of which a protrusion amount of the component storage section 100a from the conveyance reference surface 60a1 or the gap amount between the component storage sections 100a adjacent to each other is small, as illustrated in FIG. 8, by radiating the laser beam light along the conveyance reference surface 60a1 via a small through groove 88 provided near the conveyance reference surface 60a1, even when the protrusion amount of the embossed section 100a is small, or even when the gap between the embossed sections 100a adjacent to each other is small, it is possible to accurately detect the embossed section 100a.

Furthermore, the first detection section 53a detects a cavities part (gap) between the embossed section 100a of the embossed tape 100X conveyed through the conveyance path 60a and the adjacent embossed section 100a. Accordingly, based on the sensor output of the first detection section 53a, as will be described later, the pitch of the component storage section 100a of the embossed tape 100X is calculated.

In addition, as the first detection section 53a, it is also possible to use a transparent type section in which a laser light source that projects the laser beam light from one side section of the carrier tape 100 and a light receiver that receives the laser beam light projected from the laser light source are disposed to nip the carrier tape 100 and to oppose each other, and detects the presence or absence of the embossed section 100a according to the presence or absence of receiving the laser beam light by the light receiver.

Meanwhile, the second detection section 54a is configured of a photosensor including a light projector and the light receiver which nip the carrier tape 100 and vertically oppose each other. The second detection section 54a detects the component Pa at the tape part between the component storage section 100a of the paper tape 100Y that conveys the conveyance path 60a and the adjacent component storage section 100a, and in the component storage section 100a, by changing the light amount. The detection signal of the second detection section 54a is fed to the control section 23 embedded in the device main body 21, and as will be described later, the pitch of the component storage section 100a of the paper tape 100Y is calculated. In addition, as the second detection section 54a, it is also possible to use a camera instead of the photosensor.

The tape conveyance section 51a is configured of the sprocket 61a disposed below the conveyance path 60a, a stepping motor 62a which can normally and reversely rotate as a driving source connected to the sprocket 61a, and a sprocket tooth detection device 63a for positioning the sprocket 61a at an origin position. The tape conveyance section 51a conveys the carrier tape 100 along the conveyance path 60a, and is positioned at the tape detection position Ld1, the tape cutting position Lc1, and the splicing position Ls in order.

At an outer circumference of the sprocket 61a, multiple teeth 67a having a pitch which is the same as the pitch of the sprocket hole 100c of the carrier tape 100 are formed across the entire circumference. The sprocket 61a is disposed below the conveyance path 60a such that the sprocket hole 100c of the carrier tape 100 inserted through the tape insertion port 84a can mesh with the uppermost tooth 67a.

The sprocket tooth detection device 63a detects the teeth 67a of the sprocket 61a, and also detects that the teeth 67a is correctly positioned at the origin position (top point position of the sprocket 61a). 64a is a tape detection sensor which detects that the carrier tape 100 is inserted from the tape insertion port 84a.

The tape cutting section 55a is configured of a cutter for cutting 68a provided at the tape cutting position Lc1, a cam 69a which is slidably in contact with the cutter 68a, a motor 70a connected to the cam 69a, a spring 71a of which one end is attached to the cutter 68a and the other end is attached to a fixing section, a pressing member 72a provided to be adjacent to the cutter 68a, and a spring 73a of which one end is attached to the cutter 68a and the other end is attached to the pressing member 72a.

The cutter 68a cuts the cutting part CU of the carrier tape 100 positioned at the tape cutting position Lc1. The cam 69a of the tape cutting section 55a is rotated by the motor 70a, and moves the cutter 68a in the up-down direction. The pressing member 72a presses the vicinity of the cutting part CU of the carrier tape 100 positioned at the tape cutting position Lc1.

The take-in section 57a is configured of a take-in member 75a including a movable member 77a and a fixing member 78a which supports the movable member 77a to be rotatable, and a driving device 76a including a solenoid or the like which drives the movable member 77a. In the movable member 77a, a movable conveyance path 79a that forms a part of the conveyance path 60a, and an opening 80a for catching an unnecessary part of the tip portion of the carrier tape 100 conveyed on the conveyance path 60a, are formed. In the movable member 77a, a duct 82a which guides the caught unnecessary part to a disposal location, is formed.

The movable member 77a is generally held at an angle position (a state illustrated by a two-dot chain line of FIG. 7) at which the opening 80a is aligned in the conveyance path 60a, and catches the unnecessary part, and after this, by the driving device 76a, the movable conveyance path 79a is rotated to the angle position (a state illustrated by a solid line of FIG. 7) at which the movable conveyance path 79a is aligned in the conveyance path 60a.

The carrier tape 100 is cut at the cutting part CU by the tape cutting section 55a, is conveyed only by the predetermined amount D1 from the tape cutting position Lc1, and accordingly, the carrier tape 100 is positioned at the splicing position Ls, and is connected (spliced) by the tape splicing section 30. In addition, regarding the configuration of the tape splicing section 30, since it is possible to employ, for example, a configuration described in International Publication No. 2013/157107 according to the application of the applicants of the present patent, the description thereof will be omitted.

Figure 9:
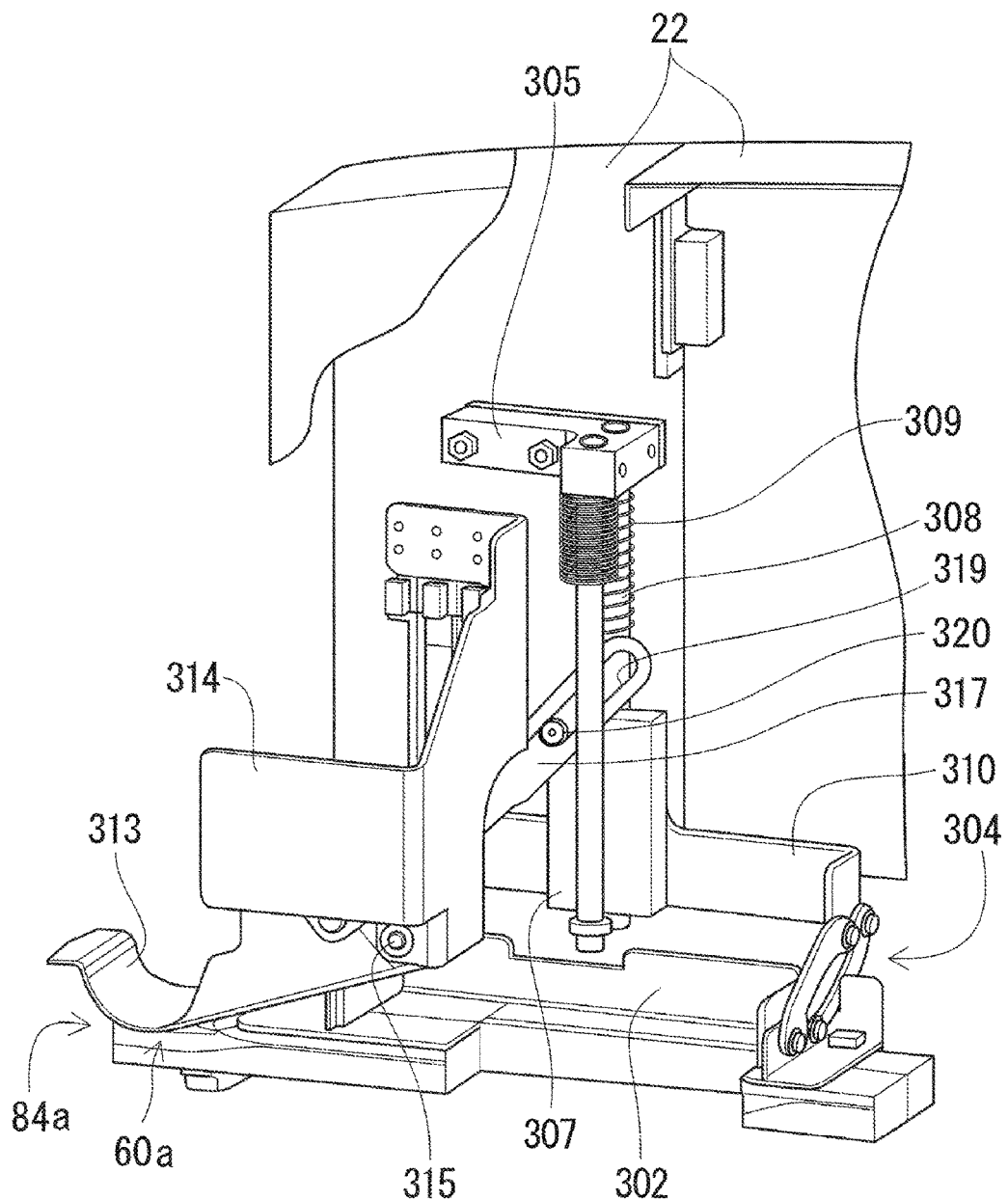
FIG. 9 is a perspective view illustrating a state where an opening and closing lever in the vicinity of a tape insertion part of the splicing device is closed.
Figure 10:
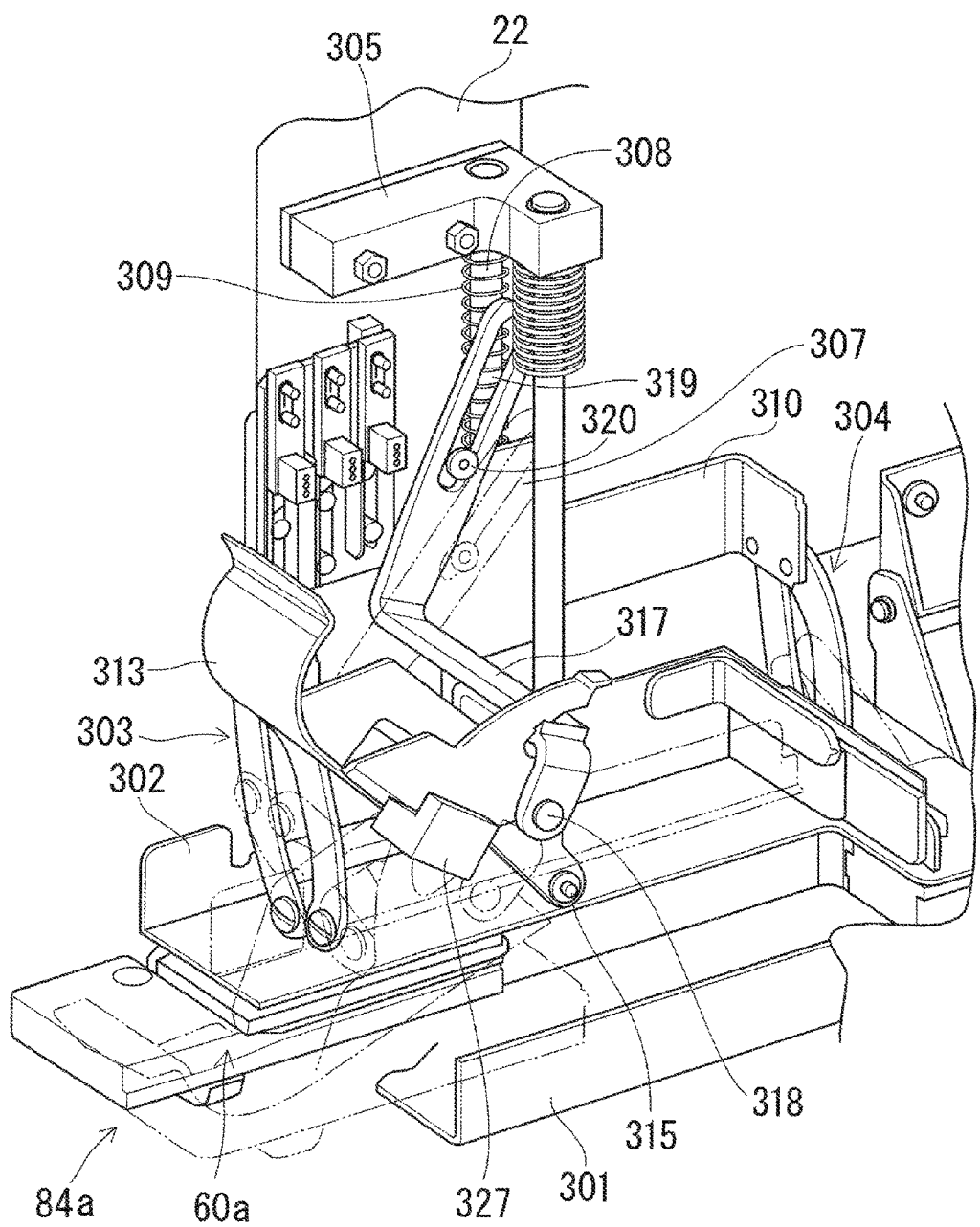
FIG. 10 is a perspective view illustrating a state where the opening and closing lever illustrated in FIG. 9 is open.
Figure 11:
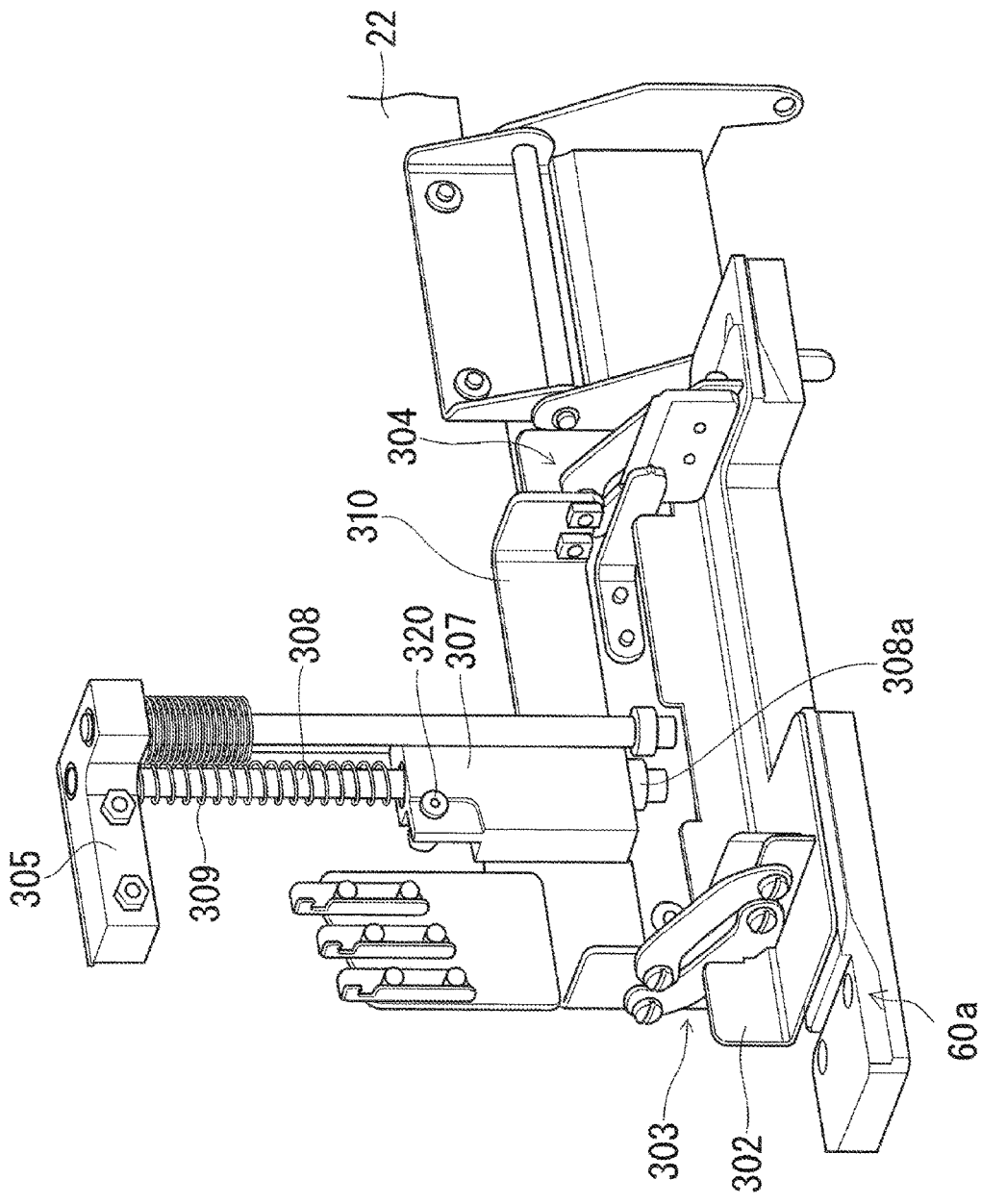
FIG. 11 is a perspective view in which a part of the configuration illustrated in FIG. 9 is omitted and is viewed from a different direction.

A conveyance width of the conveyance path 60a is determined in accordance with the width dimension of the carrier tape 100 to be conveyed in order to make it possible to convey the multiple types of carrier tapes 100 having different width dimensions. In FIGS. 9 to 11, the conveyance path 60a includes a reference guide rail 301 which functions as a reference guide section, and a movable guide rail 302 which functions as a movable guide section, and the movable guide rail 302 is provided to be movable in the width direction and to be movable in the up-down direction of the carrier tape 100, on the device main body 21.

The movable guide rail 302 is always biased in a direction in which the width of the conveyance path 60a is reduced by a spring force of a spring 309, and presses one side face on the sprocket hole 100c side of the carrier tape 100 conveyed through the conveyance path 60a to the reference guide rail 301. Each of one end sections of two parallel link mechanisms 303 and 304 which are separated from each other in the conveyance direction of the carrier tape 100 is connected to the movable guide rail 302.

The fixing block 305 is fixed to the cover 22, and a lifting and lowering body 307 is guided to be movable in the up-down direction by a guide bar 308 to the fixing block 305. The spring 309 is interposed between the lifting and lowering body 307 and the fixing block 305, and the lifting and lowering body 307 is always biased downward by the spring force of the spring 309. In addition, the lifting and lowering body 307 is held at a lowering end which abuts against a stopper 308a provided at a lower end of the guide bar 308. A lifting and lowering plate 310 is fixed to the lifting and lowering body 307 to be parallel to the movable guide rail 302, and each of the other end sections of the two parallel link mechanisms 303 and 304 is connected to both of the end sections of the lifting and lowering plate 310.

At the tape insertion port 84a of the splicing device 10, an opening and closing lever 313 is pivotally supported to be openable and closable (rotatable) regarding a pivot 315 supported to be horizontal to a fixing member 314 as a fulcrum. In addition, FIG. 9 illustrates a closed state of the opening and closing lever 313, and FIG. 10 illustrates an open state of the opening and closing lever 313.

One end of a connecting member 317 is connected to the tip portion of the opening and closing lever 313 via a connecting pin 318. A connecting long hole 319 which extends obliquely upward is formed at the other end of the connecting member 317, and the connecting long hole 319 is engaged with a follower roller 320 supported by the lifting and lowering body 307.

In a case of inserting the carrier tape 100 onto the conveyance path 60a through the tape insertion port 84a, the opening and closing lever 313 is open against the biasing force of the spring 309 by the operator. When the opening and closing lever 313 is open, this is detected by a sensor 327 (refer to FIG. 10). In other words, when the opening and closing lever 313 rotates (opens) in a clockwise direction of FIG. 10 around the pivot 315, the position of the connecting pin 318 of the connecting member 317 which is pivotally supported by the opening and closing lever 313 is raised. Accordingly, the lifting and lowering body 307 which supports the follower roller 320 engaged with the connecting long hole 319 of the connecting member 317 is raised along the guide bar 308 against the biasing force of the spring 309. As the lifting and lowering body 307 is raised, the movable guide rail 302 is moved in the horizontal direction to be separated from the reference guide rail 301 via the parallel link mechanisms 303 and 304, and the conveyance width of the conveyance path 60a widens.

After the carrier tape 100 is inserted onto the conveyance path 60a through the tape insertion port 84a, when separating the opening and closing lever 313, the opening and closing lever 313 is rotated (closed) in a counterclockwise direction of FIG. 10 around the pivot 315 by the biasing force of the spring 309.

When the opening and closing lever 313 is closed, the position of the connecting pin 318 of the connecting member 317 which is pivotally supported by the opening and closing lever 313 is lowered. Accordingly, the lifting and lowering body 307 which supports the follower roller 320 engaged with the connecting long hole 319 of the connecting member 317 is lowered by the biasing force of the spring 309, and as the lifting and lowering body 307 is lowered, the movable guide rail 302 is moved in the direction of approaching the reference guide rail 301 on the contrary to the description above via the parallel link mechanisms 303 and 304, and the conveyance width is reduced.

Accordingly, one side face of the carrier tape 100 inserted onto the conveyance path 60a is pressed by the movable guide rail 302, and the other side face (side face on the sprocket hole 100c side) of the carrier tape 100 is pressed to the reference guide rail 301.

The opening and closing lever 313 having the above-described configuration is also provided on the tape insertion port 84b side, and the conveyance width of the conveyance path 60b is also determined in accordance with the width dimension of the carrier tape 100 similar to the description above.

Next, an operation of the splicing device 10 in the above-described embodiment will be described. In addition, when the components held by the carrier tape 100 which is in use in the tape feeder which is not illustrated is ran out (the residual amount decreases), splicing processing of connecting the starting end section of the new carrier tape 100 which is the same type to the tail end section of the carrier tape 100 by using the splicing tape, is performed.

When performing the splicing, so-called splicing verification, that is, checking whether or not the two carrier tapes 100 store the same type of components therein, is performed. When the splicing verification is finished, for example, by allowing the empty component storage sections 100a to remain two by two, each of the end sections of the two carrier tapes 100 is cut by scissors.

In the splicing device 10, in general, the cover 22 is closed, and in this state, a power supply of the splicing device 10 is ON by the operator. By turning the power supply ON, the control section 23 initiates the stepping motors 62a and 62b, and starts the rotation of the sprockets 61a and 61b. In addition, based on the detection signal from the sprocket tooth detection devices 63a and 63b, the stepping motors 62a and 62b are positioned at the origin position.

In this state, the opening and closing lever 313 provided at the tape insertion ports 84a and 84b on both sides of the splicing device 10, and by the tape insertion ports 84a and 84b, each of the end sections of the two carrier tapes 100 is respectively inserted onto the conveyance paths 60a and 60b. By opening the opening and closing lever 313, the movable guide rail 302 is moved in a direction of being separated from the reference guide rail 301, and the conveyance width widens.

After inserting the two carrier tapes 100, when closing the opening and closing lever 313, the position of the connecting pin 318 of the connecting member 317 which is pivotally supported by the opening and closing lever 313 is lowered. Accordingly, the lifting and lowering body 307 which supports the follower roller 320 engaged with the connecting long hole 319 of the connecting member 317 is lowered by the biasing force of the spring 309. In addition to this, as the lifting and lowering body 307 is lowered, the movable guide rail 302 is moved in a direction of approaching the reference guide rail 301 via the parallel link mechanisms 303 and 304, and the conveyance width is reduced.

Accordingly, one side face of the carrier tape 100 inserted onto the conveyance paths 60a and 60b is pressed by the movable guide rail 302, and the other side face (side face on the sprocket hole 100c side) of the carrier tape 100 is pressed to the reference guide rail 301. In addition, the movable guide rail 302 is stopped to abut against the carrier tape 100.

When the carrier tape 100 is inserted into the tape insertion ports 84a and 84b, the control section 23 detects that the tip portion of the carrier tape 100 is inserted from the tape insertion ports 84a and 84b based on the detection signal from tape detection sensors 64a and 64b.

Figure 12:
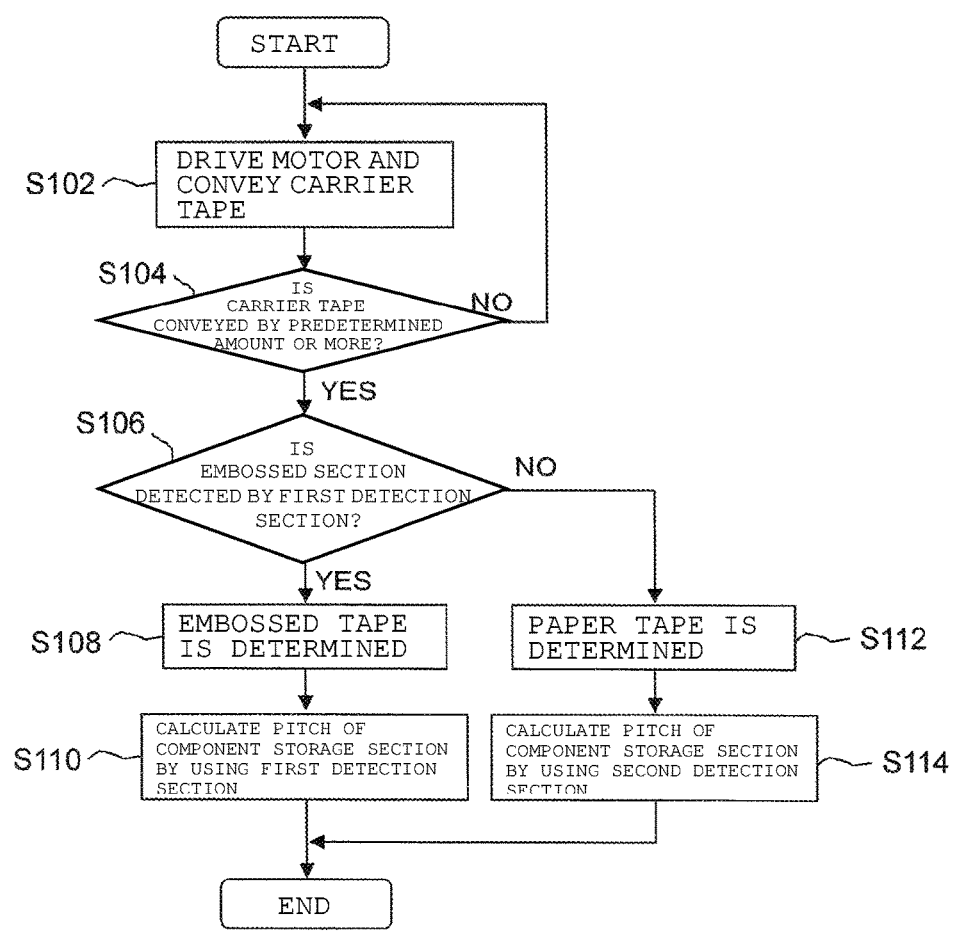
FIG. 12 is a flowchart for determining whether a tape inserted into the splicing device is the embossed tape or the paper tape.

Next, a determination program executed by the control section 23 for determining whether the carrier tape 100 inserted into the splicing device 10 is the embossed tape 100X or the paper tape 100Y by the first detection sections 53a and 53b, will be described based on the flowchart of FIG. 12.

When the determination program is initiated, in step S102, the control section 23 initiates the stepping motors 62a and 62b and rotates the sprockets 61a and 61b, and pitch-conveys the carrier tape 100 at a constant pitch (Ph/2) toward the tape detection positions Ld1 and Ld2.

In step S104, it is determined whether or not the carrier tape 100 is conveyed by a predetermined amount or more, that is, whether or not the sprockets 61a and 61b are rotated by a predetermined amount or more. Here, in a case of the embossed tape 100X, the predetermined amount is set to be a value which is the same as or smaller than the maximum arrangement pitch of the embossed section 100a in the embossed tape 100X such that the embossed section (component storage section) 100a can be accurately detected. In a case where the determination result of step S104 is N (NO), the process returns to step S100, and the conveyance of the carrier tape 100 continues.

When the determination result is Y (YES) in step S104, then, in step S106, the control section 23 determines whether or not the embossed section 100a that protrudes to a lower position from the conveyance reference surface 60a1 is detected by the first detection sections 53a and 53b (laser sensor 87) while the embossed tape 100X is conveyed by the predetermined amount or more, that is, whether or not the laser beam light is shielded by the embossed section 100a, based on the sensor output of the laser sensor 87.

In step S106, when it is determined that the embossed section 100a is detected (determination result is YES), the process moves to step S108, and the control section 23 determines that the carrier tape 100 in the middle of being conveyed on the conveyance paths 60a and 60b is the embossed tape 100X. Next, in step S110, the control section 23 performs the processing of calculating the pitch of the component storage section 100a of the embossed tape 100X by using the first detection sections 53a and 53b which are used when determining the tape.

Figure 13A:
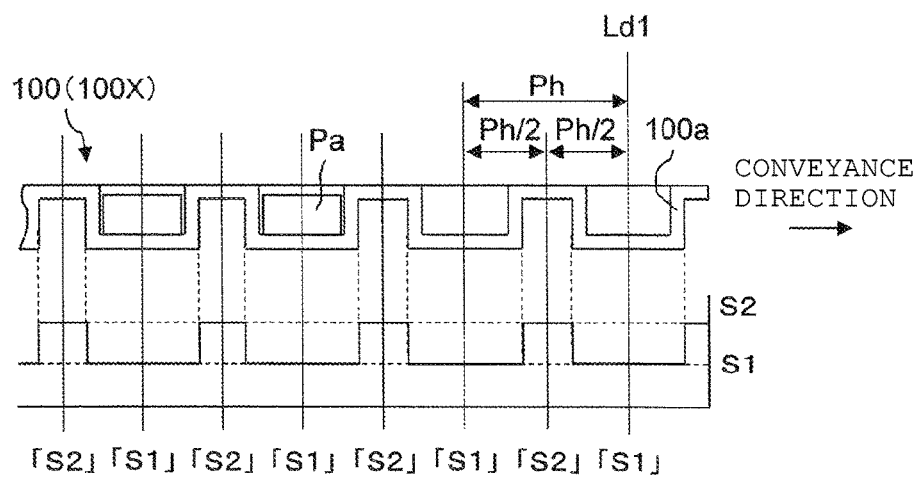
FIG. 13A is a view illustrating a detection signal of the first detection section.

In other words, when the embossed section 100a of the embossed tape 100X goes across the first detection sections 53a and 53b which are installed at the tape detection positions Ld1 and Ld2, the sensor output of the first detection sections 53a and 53b changes, and the output signal is transmitted to the control section 23. Here, as illustrated in FIG. 13A, while the sensor output of the first detection sections 53a and 53b configured of the laser sensor 87 is a low value "S1" as the laser beam light is shielded in the embossed section 100a, at the cavities part between the embossed sections 100a, the sensor output is a high value "S2" since the laser beam light is reflected by the reflection plate 87b without being shielded and is received by the sensor main body 87a. Therefore, while the embossed tape 100X is conveyed by the predetermined amount or more, it is possible to determine the embossed tape 100X or the paper tape 100Y based on whether or not the embossed section 100a is detected by the first detection sections 53a and 53b (laser sensor 87).

In addition, every time when the embossed tape 100X is conveyed at a constant pitch (Ph/2), the control section 23 determines that the initial component Pa is stored in the component storage section 100a in a case of inputting the sensor output from the first detection sections 53a and 53b and inputting the third "S1".

Figure 13B:
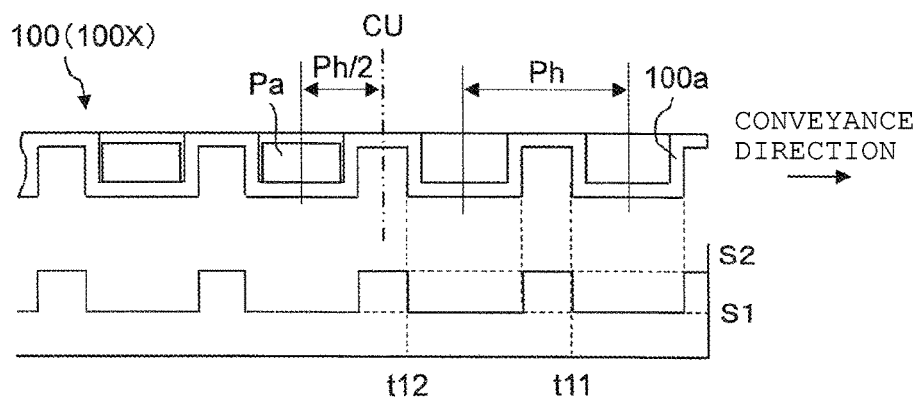
FIG. 13B is a description view for detecting the cutting part at which the embossed tape is cut by using the first detection section.

Furthermore, the control section 23 calculates the pitch of the component storage section 100a based on the detection signal of the first detection sections 53a and 53b. In other words, as illustrated in FIG. 13B, by detecting a rise time t11 of the sensor output "S1" of the first detection sections 53a and 53b and a rise time t12 of the next sensor output "S1", and by counting a pulse number (rotation angle) of the stepping motors 62a and 62b which are required for driving the sprockets 61a and 61b between the time t11 and the time t12, the pitch of the component storage section 100a is calculated. In addition, in accordance with the calculated pitch, the cutting part CU is determined as will be described later.

Meanwhile, when it is determined that the embossed section 100a is not detected in step S106 (the detection result is NO), the process moves to step S112, and the control section 23 determines that the carrier tape 100 in the middle of being conveyed on the conveyance paths 60a and 60b is the paper tape 100Y. Next, in step S114, the control section 23 performs the processing of calculating the pitch of the component storage section 100a of the paper tape 100Y by using the second detection sections 54a and 54b different from the first detection sections 53a and 53b.

Figure 14A:
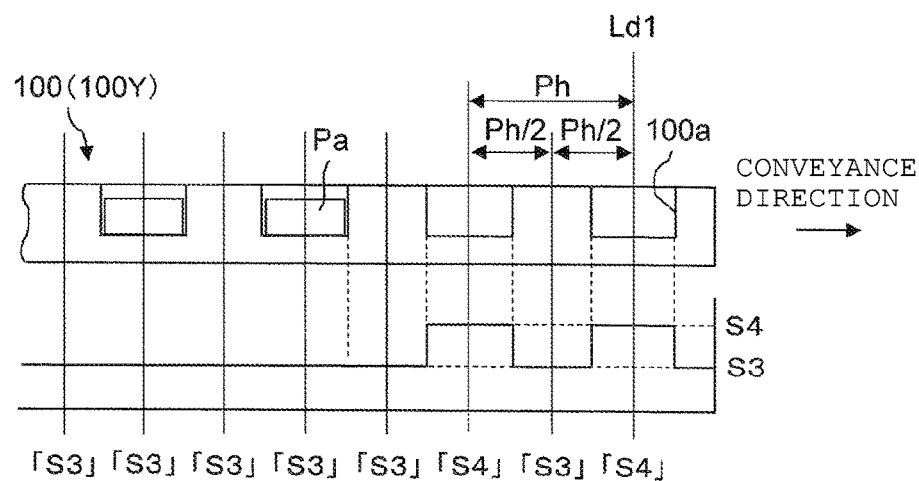
FIG. 14A is a view illustrating a detection signal of a second detection section.

In other words, when the paper tape 100Y goes across the second detection sections 54a and 54b which are installed at the tape detection positions Ld1 and Ld2, the output signal of the second detection sections 54a and 54b changes, and the output signal is transmitted to the control section 23. As the paper tape 100Y is conveyed, as illustrated in FIG. 14A, when the tape main body part passes the tape detection position Ld1 between the component storage section 100a and the component storage section 100a, while the detection signal of the second detection sections 54a and 54b configured of the photosensor is "S4" (a signal that there is no component) since a transparency amount increases at a part of the empty component storage section 100a in which there is no component Pa, the detection signal is "S3" (signal that there is a component) which is lower than "S4" since the transmitted light amount is reduced according to the thickness of the tape or the component Pa at the tape main body part between the component storage sections 100a and at a part of the component storage section 100a in which the component Pa is stored.

Every time when the paper tape 100Y is conveyed at a constant pitch (Ph/2), in a case where the signal "S3" that there is a component from the second detection sections 54a and 54b is input, and this is detected continuously two times, the control section 23 determines that the initial component Pa is stored in the component storage section 100a. Meanwhile, the control section 23 calculates the pitch of the component storage section 100a based on the detection signal of the second detection sections 54a and 54b.

Figure 14B:
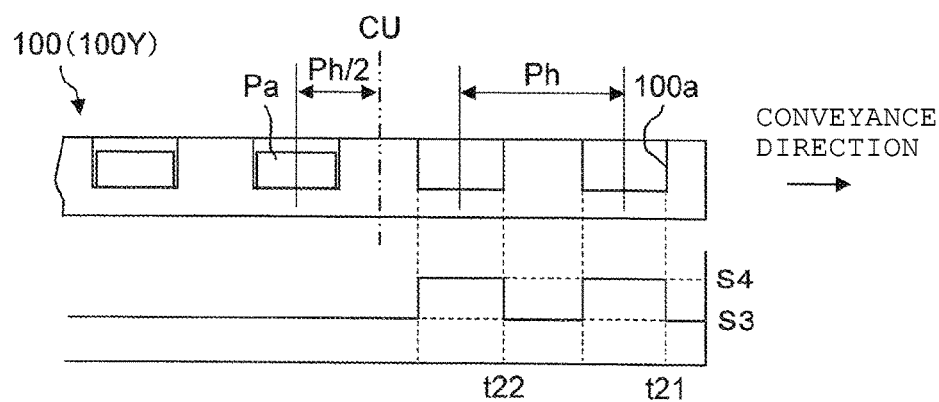
FIG. 14B is a description view for detecting the cutting part at which the paper tape is cut by using the second detection section.

In other words, since two empty component storage sections 100a in which the component Pa is not stored are provided in the end section of the paper tape 100Y, as illustrated in FIG. 14B, by detecting a rise time t21 of the detection signal "S3" (signal that there is no component) of the second detection sections 54a and 54b, and a rise time t22 of the next detection signal "S3", and by counting the pulse number (rotation angle) of the stepping motors 62a and 62b which are required for driving the sprockets 61a and 61b between the time t21 and the time t22, the pitch of the component storage section 100a is calculated. In addition, in accordance with the calculated pitch, the cutting part CU is determined as will be described later.

By the calculation processing of the above-described step S110 or step S114, in a case where the pitch of the component storage section 100a is the same as the pitch Ph of the sprocket hole 100c, for example, as illustrated in FIG. 6B, the carrier tape 100 is controlled to be moved only by a conveyance pitch (Ph/2) regarding the position at which the third "S1" is output (refer to FIG. 13A) or the position at which the signal "S3" that there is a component is output continuously two times (refer to FIG. 14A) as a starting point. According to this, the cutting part CU which is in advance of the center position of the component storage section 100a in which the initial component Pa is stored only by the pitch (Ph/2) is positioned to be the tape detection positions Ld1 and Ld2.

In the state, the motors 70a and 70b of the tape cutting sections 55a and 55b are driven, and by the cutters for cutting 68a and 68b, the cutting part CU of the carrier tape 100 is cut. After this, as the carrier tape 100 is conveyed only by the predetermined amount D1 from the tape cutting positions Lc1 and Lc2, the carrier tape 100 is positioned at the splicing position Ls, the distal ends of the two carrier tapes 100 abut against each other, and the carrier tape 100 is spliced by the tape splicing section 30.

In addition, in a case where any one of the first detection sections 53a and 53b detects the embossed section 100a (determines that the embossed section 100a is the embossed tape 100X) and the other one does not detect the embossed section 100a (determines that the embossed section 100a is the paper tape 100Y), the control section 23 feeds an abnormal signal by determining that the different type of carrier tape 100 is inserted, and notifies the operator of the abnormal signal.

By the above-described step S106, a discrimination section which determines whether the carrier tape 100 inserted into the splicing device 10 is the embossed tape 100X or the paper tape 100Y based on the detection signal of the first detection sections 53a and 53b, is configured. In addition, by the above-described step S110, a first calculating section which calculates the pitch of the component storage section 100a of the embossed tape 100X by using the first detection sections 53a and 53b is configured, and by step S114, a second calculating section which calculates the pitch of the component storage section 100a of the paper tape 100Y by using the second detection sections 54a and 54b is configured.

According to the above-described embodiment, the splicing device 10 includes the first detection sections 53a and 53b which detect whether or not the component storage section 100a protrudes downward from the conveyance reference surface 60a1, the second detection sections 54a and 54b for detecting the component storage section 100a of the paper tape 100Y, the discrimination section which determines whether the carrier tape 100 inserted into the splicing device 10 is the embossed tape 100X or the paper tape 100Y based on the detection signal of the first detection sections 53a and 53b (step S106), the first calculating section which calculates the pitch of the component storage section 100a of the embossed tape 100X by the first detection sections 53a and 53b in a case where the discrimination section determines that the embossed tape 100X is inserted (step S110), and the second calculating section which calculates the pitch of the component storage section 100a of the paper tape 100Y by the second detection sections 54a and 54b in a case where the discrimination section determines that the paper tape 100Y is inserted (step S114).

Accordingly, in accordance with the discrimination result whether the carrier tape 100 is the embossed tape 100X or the paper tape 100Y, by using each of the detection sections that corresponds to the characteristics of the embossed tape 100X or the paper tape 100Y, it is possible to accurately calculate the pitch of the component storage section 100a of both of the tapes. As a result, in accordance with the pitch of the component storage section 100a, it is possible to respectively cut the embossed tape 100X and the paper tape 100Y at accurate cutting part. In addition, by the discrimination section (step S106), since it is possible to determine that the embossed tape 100X is inserted into one and the paper tape 100Y is inserted into the other one, it is possible to prevent wrong splicing in advance.

According to the above-described embodiment, the first detection sections 53a and 53b are configured of the laser sensor 87 which receives the laser light radiated along the conveyance reference surface 60a1. Accordingly, it is possible to easily determine the embossed tape 100X or the paper tape 100Y by the laser sensor 87.

According to the above-described embodiment, the laser sensor 87 is the regressive reflection type laser sensor configured of the sensor main body 87a and the reflection plate 87b. Accordingly, regardless of the material or transparency of the resin of the embossed tape 100X, it is possible to accurately detect the presence or absence of the embossed section 100a.

According to the above-described embodiment, the laser sensor 87 radiates the laser light via the small through groove 88 which corresponds to the minimum protrusion amount of the embossed section (component storage section) 100a of the embossed tape 100X or the minimum gap amount between the embossed sections 100a adjacent to each other. Accordingly, even when the protrusion amount of embossed section 100a is small, or even when the gap between the adjacent embossed sections 100a is small, it is possible to accurately detect the embossed section 100a.

In addition, according to the above-described embodiment, the tape detecting method in the splicing device 10 includes detecting whether or not the component storage section 100a protrudes downward from the conveyance reference surface 60a1 by the regressive reflection type laser sensor 87, and calculating the pitch of the component storage section 100a of the embossed tape 100X by the laser sensor 87.

Accordingly, by the regressive reflection type laser sensor 87, regardless of the material or transparency of the embossed tape 100X, it is possible to realize the tape detecting method which can accurately detect the presence or absence of the embossed section 100a.

In addition, as the first detection sections 53a and 53b, by using the regressive reflection type laser sensor, regardless of the material or transparency of the embossed tape 100X, it is possible to accurately detect the embossed section (component storage section) 100a, but according to the material or the like of the resin, in addition to the laser sensor, it is also possible to use a visible light sensor or an ultrasonic sensor, and it is also possible to use any type of a reflection type and a projection type in a case of the visible light sensor.

Above, the present disclosure is described based on the embodiment, but the present disclosure is not limited to the configuration described in the embodiment, it is possible to employ various aspects within a range that does not depart from the spirit of the present disclosure described in the range of the claims.

INDUSTRIAL APPLICABILITY

The splicing device and the tape detecting method using the same according to present disclosure are employed in splicing the embossed tape and the paper tape which have different pitches of the component storage section.

REFERENCE SIGNS LIST

10 . . . splicing device, 21 . . . device main body, 22 . . . cover, 23 . . . control section, 51a, 51b . . . tape conveyance section, 53a, 53b . . . first detection section, 54a, 54b . . . second detection section, 55a, 55b . . . tape cutting section, 60a1 . . . conveyance reference surface, 87 . . . laser sensor, 87a . . . sensor main body, 87b . . . reflection plate, 88 . . . through groove, Ld1, Ld2 . . . tape detection position, Lc1, Lc2 . . . tape cutting position, Ls . . . splicing position, 100 . . . carrier tape, 100a . . . component storage section (embossed section), 100c . . . sprocket hole, S106 . . . discrimination section, S110 . . . first calculating section, S114 . . . second calculating section

The invention claimed is:

1. A splicing device which configured to splice an embossed tape in which component storage sections are formed at a constant interval at a lower position than a conveyance reference surface, and a paper tape in which the component storage sections are formed at a constant interval at an upper position than the conveyance reference surface, the device comprising:
 a first detection section arranged on respective sides of the conveyance reference surface which detects whether or not the component storage section protrudes downward from the conveyance reference surface, the first detection section including a laser sensor which receives laser light radiated horizontally across the conveyance reference surface;

a second detection section arranged above and below the conveyance reference surface which detects the component storage section of the paper tape;

a discrimination section which determines whether a tape inserted into the splicing device is the embossed tape or the paper tape based on a detection signal of the first detection section;

a first calculating section which calculates a pitch of the component storage sections of the embossed tape by using the first detection section in a case where the discrimination section determines that the embossed tape is inserted; and a second calculating section which calculates a pitch of the component storage sections of the paper tape by using the second detection section in a case where the discrimination section determines that the paper tape is inserted.

2. The splicing device according to claim 1, wherein the laser sensor is a regressive reflection type laser sensor configured of a sensor main body and a reflection plate.

3. The splicing device according to claim 1, wherein the laser sensor radiates the laser light via a small through groove that corresponds to a minimum protrusion amount of the component storage section of the embossed tape or a minimum gap amount between the component storage sections adjacent to each other.

4. A tape detecting method which is used in a splicing device configured to splice an embossed tape in which component storage sections are formed at a constant interval at a lower position than a conveyance reference surface, and a paper tape in which the component storage sections are formed at a constant interval at an upper position than the conveyance reference surface, the method comprising:

detecting whether or not the component storage section protrudes downward from the conveyance reference surface by a regressive reflection type laser sensor, arranged on respective sides of the conveyance reference surface, that receives laser light radiated horizontally across the conveyance reference surface, detecting the component storage section of the paper tape by a detection section arranged above and below the conveyance reference surface, and calculating a pitch of the component storage sections of the embossed tape by the laser sensor.

* * * * *